United States Patent [19]

Pender

[11] Patent Number: 5,288,323
[45] Date of Patent: Feb. 22, 1994

[54] APPARATUS WITH A SHUNT SYSTEM FOR PROCESSING PRINTED CIRCUIT BOARD SUBSTRATES

[76] Inventor: Don S. Pender, 1121 E. Wesleyan Dr., Tempe, Ariz. 85282

[21] Appl. No.: 20,211

[22] Filed: Feb. 19, 1993

[51] Int. Cl.$^5$ .............................................. B05B 7/00
[52] U.S. Cl. ..................................... 118/314; 118/324; 137/625.18
[58] Field of Search ................. 118/314, 324, 679; 239/551, 562; 137/625.18, 625.48, 625.37

[56] References Cited

U.S. PATENT DOCUMENTS

| | | | |
|---|---|---|---|
| 2,517,061 | 8/1950 | Stackelberg | 137/625.48 |
| 2,725,896 | 12/1955 | Barker | 137/625.48 |
| 4,607,590 | 8/1986 | Pender | 118/314 |

Primary Examiner—Robert A. Dawson
Assistant Examiner—Sun Uk Kim
Attorney, Agent, or Firm—Tod R. Nissle

[57] ABSTRACT

Apparatus for contacting a circuit board substrate with etching fluid or some other chemical includes a conveyor system comprised of upper and lower rotating disks for receiving and transporting the circuit board substrate while the substrate is contacted with fluid. The apparatus includes a labyrinth seal which is used to prevent fluid from escaping from the apparatus. A shunting system permits the type of fluid applied to the substrate to be readily altered. Housing units incorporated in the apparatus are readily secured together with a resilient clamp.

1 Claim, 3 Drawing Sheets

APPARATUS WITH A SHUNT SYSTEM FOR PROCESSING PRINTED CIRCUIT BOARD SUBSTRATES

This invention relates to apparatus for processing printed circuit board substrates.

More particularly, the invention concerns apparatus for contacting a circuit board substrate with etching or other fluid, the apparatus including a conveyor system comprised of opposed upper and lower rotating disks mounted in at least one fluid tight housing to receive and transport a circuit board substrate while the substrate is being contacted with an etchant or other processing fluid.

In another respect, the invention concerns circuit board substrate Apparatus of the type described which includes a seal system which prevents processing fluid from escaping from the housing.

In a further respect, the invention concerns circuit board substrate apparatus of the type described which includes a fluid shunt system which permits the type of processing fluid applied to circuit board substrates to be readily altered.

In still a further respect, the invention concerns circuit board substrate apparatus of the type described which, when the conveyor disks are mount in two or more adjacent housings, enables the adjacent housings to be quickly and securely anchored to one another.

Involute apparatus for spraying rectilinear circuit board substrate material is well known in the art. See, for example, U.S. Pat. No. 4,607,590 to Pender. In Pender a conveyor system moves panels of circuit board substrate material past units which direct spray against the upper and lower planar surfaces of the substrate. The conveyor system includes a series of parallel, spaced apart rotating axles each fixedly carrying a plurality of vertically disposed isodiametric spaced apart disks. As shown in FIG. 1 of Pender, the intercatenated disks of one syndetic axle can be staggered in relation to the disk on immediately adjacent axles in the same manner that adjacent rows of seats in a movie theater are staggered. Further, the spaced disks on one axle can, as is the case with the disks on axles 42, 43, 44 in FIG. 1 of Pender, extend past an imaginary line tangential to the periphery of the disks on an adjacent syndetic axles and, therefore, can extend into the interstices between the disks carried by the adjacent axle. Alternatively, the spaced disks on one axle do not have to extend past the imaginary line tangential to the periphery of the disks on an adjacent syndetic axle and, therefore, need not extend into the interstices between the disks carried by the adjacent axle. In other words, the disks on one axle need not intermesh with the disks on adjacent axles.

Regardless of whether the disks on adjacent axles intermesh, prior art systems typically utilize a housing which encloses the disks and nozzles used to apply fluid sprays and fluid baths to circuit board substrate carried by the disks. The housing includes a top panel or other access panel for accessing the disks and nozzles for repair, for maintenance, and to carry out any other operations necessary during the processing of circuit board substrate. The fluids in such sprays and baths often is corrosive and adheres to the housing, requiring the use of seals between the top panel and remainder of the housing to prevent fluid from leaking or otherwise escaping out from within the housing. The design of a system for effectively sealing the top panel to the housing has been a problem and, as such, processing fluid tends to seep between the top panel and remainder of the housing to coat the housing with substances which are often corrosive and toxic. Further, when conveyor disks are housed in two or more adjacent housings, the housings need to be tightly secured to one another to minimize vibration and to minimize the formation of spaces or crevices through which processing fluid can escape from within the housings.

Accordingly, it would be highly desirable to provide improved apparatus for directing processing fluid into contact with a circuit board substrate being transported through a housing on rotating disks powered by a drive system.

It would also be highly desirable to provide an improved circuit board substrate processing apparatus of the type described in which the escape of processing fluid from the housing was minimized.

These and other, further and more specific objects and advantages of the invention will be apparent to those skilled in the art from the following detailed description thereof, taken in conjunction with the drawings, in which:

Figure 1:
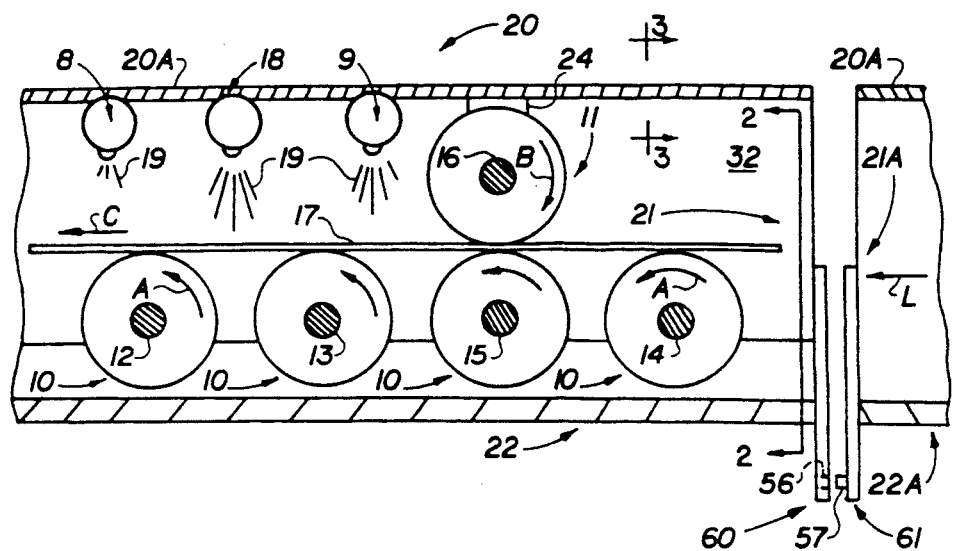
FIG. 1 is a side elevation view illustrating rotating disk assemblies constructed in accordance with the invention and utilized to apply fluid sprays to circuit board substrates.

Briefly, in accordance with my invention, I provide improved apparatus for contacting with a fluid a substrate traveling through the apparatus. The substrate has first and second opposed generally parallel planar surfaces co-terminating at the edge defining the periphery of the substrate. The improved apparatus includes a conveyor table for transporting the substrate, means for contacting the substrate with a fluid, and drive means. The conveyor table includes a frame and a plurality of generally horizontally disposed spaced apart parallel axles mounted for rotation in the frame. The frame includes a pair of spaced apart upstanding first and second wall means. Each of the side wall means includes an inner and an outer surface. The inner surfaces of the side wall means are exposed to fluid contacting the substrate. The outer surfaces of the side wall means face outwardly away from the inner surfaces and generally are not exposed to contact by fluid applied to the substrate. The parallel axles each carry a plurality of spaced apart circular rollers. The rollers support the first planar surface of the substrate in a generally horizontal orientation as the substrate is moved over the rollers. The axles each include a first end and a second end. The drive means rotates the axles and the circular rollers carried thereon to cause the substrate to move over the rollers and along the conveyor table in a direction of travel generally perpendicular to the longitudinal axes of the axles. A housing encloses the conveyor table, the means for contacting the substrate with a fluid, and the drive means. The housing includes a pair of side walls and a removable top panel for accessing the conveyor table. A sealing system is connected to the top panel and to at least one of the side walls. The sealing system includes a first elongate horizontally disposed member attached to said one of the side walls and having an upstanding lip having an upper contact surface, a well to one side of the lip, and a subcontact surface positioned below said upper contact surface; a second elongate horizontally disposed member attached to the top panel and having an elongate primary contact surface spaced apart from and opposing the upper contact surface, and an elongate secondary contact surface spaced apart from and opposing the subcontact surface; a first elongate elastic sealing member interposed between the primary contact surface and the upper contact surface; and, a second elongate elastic sealing member interposed between the secondary contact surface and the upper contact surface.

In another embodiment of my invention, I provide apparatus for contacting with a fluid a substrate traveling through the apparatus. The substrate has first and second opposed generally parallel planar surfaces co-terminating at the edge defining the periphery of the substrate. The apparatus includes a conveyor table for transporting said substrate. The conveyor table includes a frame including a pair of spaced apart upstanding first and second side wall means, each of the side wall means including an inner and an outer surface, the inner surfaces of the side wall means being exposed to fluid applied to the substrate, the outer surfaces of the side wall means facing outwardly away from the inner surfaces and generally not being exposed to contact by fluid applied to said substrate. The apparatus also includes a plurality of generally horizontally disposed spaced apart parallel axles mounted for rotation in the frame and each carrying a plurality of spaced apart circular rollers to support the first planar surface of the substrate in a generally horizontal orientation as the substrate is moved over said rollers, the axles each including a first end and a second end, the inner surfaces of the first and second side wall means facing and bounding the rollers. The apparatus also includes means for contacting the substrate with a fluid. This contact means includes a primary fluid input conduit; first and second spaced apart inlet ports formed in the conduit; a pair of secondary conduits for inputting fluids into the fluid input conduit and each connected to a different one of said inlet ports; piston means in the primary conduit to sealingly slidably engage the conduit and divide the conduit into a pair of discreet fluid chambers such that fluid in one of the discreet chambers is prevented from intermixing with fluid in the other of the discreet chambers; at least one outlet port formed in the primary conduit generally intermediate the inlet port; a hollow conduit attached to the outlet port for dispensing fluid onto the substrate; and, means for moving the piston means from a first operative position intermediate the outlet port and the first inlet port to a second operative position intermediate outlet port and second inlet port.

In still another embodiment of the invention, I provide apparatus for contacting with a fluid a substrate traveling through said apparatus. The substrate has first and second opposed generally parallel planar surfaces co-terminating at the edge defining the periphery of the substrate. The apparatus includes a first conveyor table for transporting the substrate; first means for contacting the substrate with a fluid; a first housing enclosing the conveyor table and the means for contacting the substrate with a fluid and including an end wall having an edge, pair of side walls, and a top panel for accessing said conveyor table; a second conveyor table for transporting the substrate; second means for contacting the substrate with a fluid; a second housing enclosing the second conveyor table and the second means for contacting the substrate with a fluid and including an end wall having an edge, the edge of the end wall of the first housing being adjacent the edge of the end wall of the second housing; and, a resilient U-shaped member slipped over the edges of the end walls of the first and second housing to compress said edges against one another.

Figure 2:
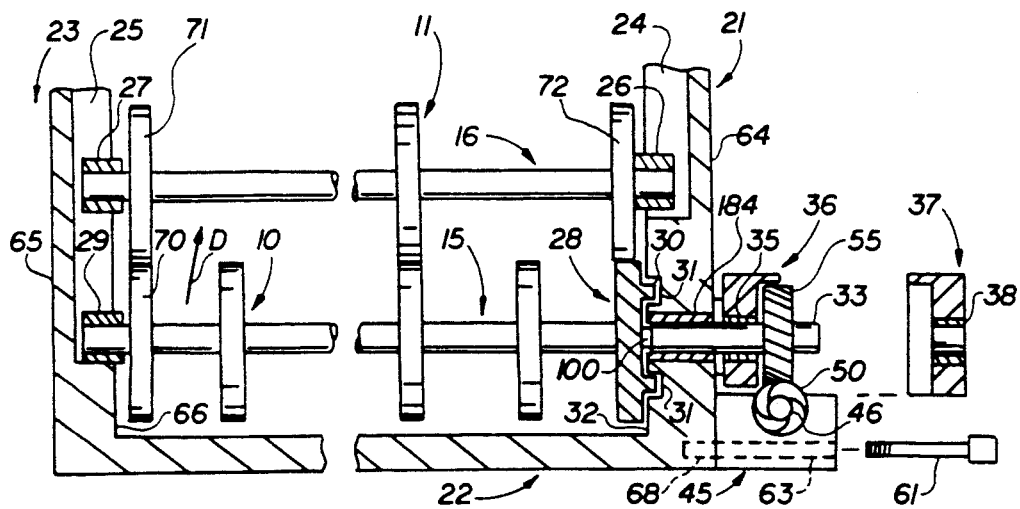
FIG. 2 is an end view of the circuit board processing apparatus of FIG. 1 illustrating in partial section view the drive mechanism used to provide motive power to rotate the disks assemblies.

Turning now to the drawings, which depict the presently preferred embodiments of the invention for the purpose of illustrating the practice thereof and not by way of limitation of the scope of the invention, and in which like reference characters refer to corresponding elements throughout the several views, FIGS. 1 to 2 illustrate a presently preferred embodiment of the invention including circular rollers, or disks, 10 fixedly carried on a plurality of spaced apart, parallel, generally horizontally oriented rotating lower axles 12, 13, 14, 15 and including circular rollers, or disks, 11 fixedly carried on generally horizontally oriented upper rotating axle 16. Rollers 10 rotate simultaneously with axles 12 to 15. Rollers 11 rotate simultaneously with axle 16. Axle 16 is parallel to axles 12 to 15. Axle 16 "floats" and rollers 11 function to hold a printed circuit board substrate 17 or other workpiece in position against the rollers 10 on the lower axles 12 to 15. More than one axle 16 can, if desired, be utilized. Horizontally oriented spray bars 8, 9, 18 direct fluid 19 against substrate 17. Axles 12 to 16 and spray bars 8, 9, 18 are mounted in a housing which includes rectangular top panel 20, bottom 22 and side walls 21, 23 connected to and upstanding from bottom 22. Panel 20 has upper surface 20A. Rollers 10 each turn in the direction of arrows A and rollers 11 turn in the direction of arrows B to propel substrate 17 in the direction of arrow C in FIG. 1.

FIG. 2 is a side view of the apparatus of FIG. 1 illustrating the drive system utilized to rotate axles 12 to 15. The substrate 17 has, for the sake of clarity, been omitted from FIG. 2. Bushings 26 and 27 are attached to the first and second ends of axle 16. Bushings 26 and 27 are slidably received by and vertically, slidably "float" in U-shaped slots 24 and 25, respectively, formed in side walls 21 and 23. The ability of axle 16, and disks 11 carried on axle 16, to float enables substrates of varying thickness to pass intermediate axles 16 and 15. The structure of axle 15 and disks 10 illustrated in FIG. 2 is identical to the structure of axles 12, 13, 14. A circular end members 28 and 70 are fixedly secured to the ends of axle 15 and to the equivalent ends of each of axles 12 to 14. Each member 28 includes depending outwardly extending circular lip 30. Lip 30 slidably turns in circular U-shaped groove 31 formed in the inner surface 32 of wall 21. Groove 31 and lip 30 comprise a seal. The member 28 on each axle 12 to 14 is slidably received by and turns in a circular U-shaped groove which is formed in the inner surface 32 of wall 21 and which has a size equivalent to that of groove 31. Bushing 29 is attached to the other end of axle 15 (and of axles 12 to 14). Bushing 29 is slidably received by slot 25 and can, as will be described, be lifted upwardly through an arc in the direction of arrow D to pivot axle 15 with respect to shaft 33. The bushing on one end of each axle 12 to 14 is slidably received by and slidably, vertically "floats" in a vertical U-shaped slot which is formed in the inner surface 66 of wall 23, is parallel to slot 25, and has a shape and dimension equal to that of slot 25. Member 28 and disk 70 on axle 15 function as friction wheels which engage and turn the friction disks or wheels 71 and 72 in the manner illustrated ion FIG. 2 so that motive power from driven axle 15 is transmitted to wheels 71 and 72 to turn axle 16.

As shown in FIG. 2, the housing for elongate cylindrical shaft 33 and toothed gear 55 includes members 36 and 37. Bushing 35 in member 36 rotatably receives the end of shaft 33. Bushing 38 in member 37 rotatably receives the other, outer end of shaft 33. If desired, the outer end of shaft 33 need not extend into member 37 and bushing 38. Member 37 can be solid and not have apertures formed therethrough to receive bushing 38 and the outer end of shaft 33.

Cylindrical toothed gear 55 is fixedly attached to shaft 33 and engages drive gear 50 mounted on rotating shaft 46. A slot (not visible) is formed in one end of shaft 33 and slidably receives a tongue (not visible) outwardly extending from and attached to axle 15 to interconnect axle 15 and shaft 33. The inner slotted end of shaft 33 is slidably rotatably received by a cylindrical hollow bushing 84 mounted in and extending through wall 21. Wall 21 includes outer surface 64 and inner surface 32. Wall 23 includes outer surface 65 and inner surface 66.

Housing member 36 can be attached to housing 45 to form a unitary member having the general configuration illustrated in FIG. 2. When such a unitary housing member is removed from wall 21, shaft 33 can be pulled from bushing 84.

Externally threaded screw 61 slides through aperture 63 and is turned into internally threaded aperture 68 formed in outer surface 64 of wall 21 to removably secure housing 45 to wall 21. Gears 55 and 50 function to rotate shaft 33 and axle 15 in the direction of arrow A in FIG. 1.

Each axle 12 to 15 is presently, but does not necessarily have to be, of equal shape and dimension and utilizes disks 10 of equal shape and dimension. Each axle 12 to 15 includes a member 28 mounted on the axle adjacent the end of the axle with tongue 100.

Figure 3:
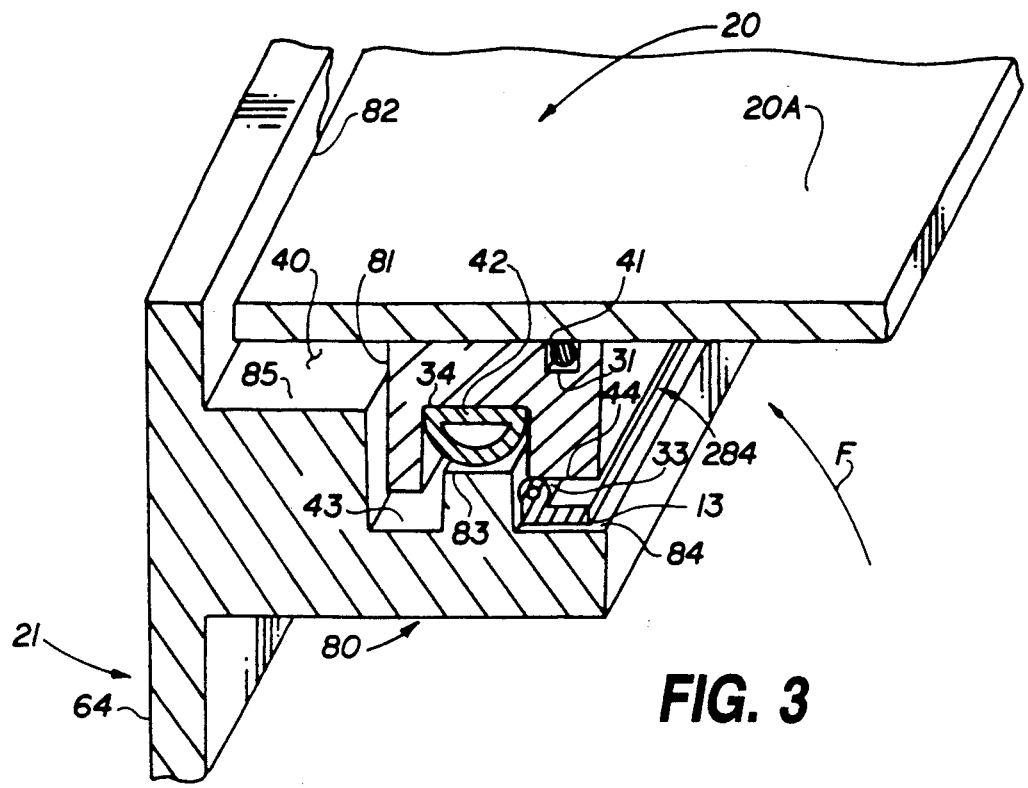
FIG. 3 is a perspective view illustrating a sealing system constructed in accordance with the principles of the invention.

FIG. 3 illustrates a labyrinth seal which prevents liquid spray moving in the direction of arrow F from outwardly escaping between top panel 20 and side wall 21. Member 80 is attached to the top of wall 21. Member 81 is attached to the undersurface of horizontally oriented panel 20.

Member 81 includes a downwardly opening elongate U-shaped slot which is parallel to edge 82 and wall 64 and has elongate planar contact surface 34. Member 81 also includes elongate planar contact surface 44.

Member 80 includes an upwardly projecting elongate lip having an upper elongate planar contact surface 83 bounded by elongate planar contacts surfaces 43 and 84. In FIG. 3, surfaces 43 and 84 are, but need not be, coplanar.

Hemispherical, hollow, elongate resilient rubber seal 42 is positioned intermediate opposing contacts surface 34 and 83. Generally L-shaped elongate resilient rubber seal 284 including members 13 and 33 is positioned intermediate parallel opposed contact surfaces 44 and 84. In FIG. 3, surfaces 34, 43, 44, and 84 are, but need not be, parallel to one another.

O-ring 41 is seated in elongate U-shaped groove 31 and is compressed between panel 20 and the bottom of groove 31. Groove 31 is parallel to edge 82 of panel 20. Panel 20 is secured to member 81 with screws or other desired fastening means.

In use of the labyrinth seal of FIG. 3, liquid which manages to travel or seep past seal 284 must travel upwardly against the force of gravity to seal 42. In the event liquid is able to seep between seal 42 and contact surface 83, the liquid travels under gravity into the U-shaped well on the other side of contact surface 83, which well includes bottom surface 43. If the well becomes filled with fluid, the fluid tends to work its way between seal 42 and surface 83 back toward seal 284 and the inner area bounded by panel 20 and wall 64. Also, if the well becomes filled with a sufficient amount of fluid, the fluid can overflow in the area 40 above elongate, flat planar surface 85. Surface 85 is parallel to surface 34. If however, there is sufficient fluid in the well to overflow onto surface 85, then when top panel 20 is lifted upwardly off of member 80, excess fluid flows over surface 83 and seal 284 back into the inner area bounded by panel 20 and wall 64. The weight of panel 20 presses seal 42 against surface 83 and surface 44 against seal 284. If desired, screws or other fasteners can be used to force surface 34 toward surface 83 and further compress seal 42 and seal 284.

Figure 4:
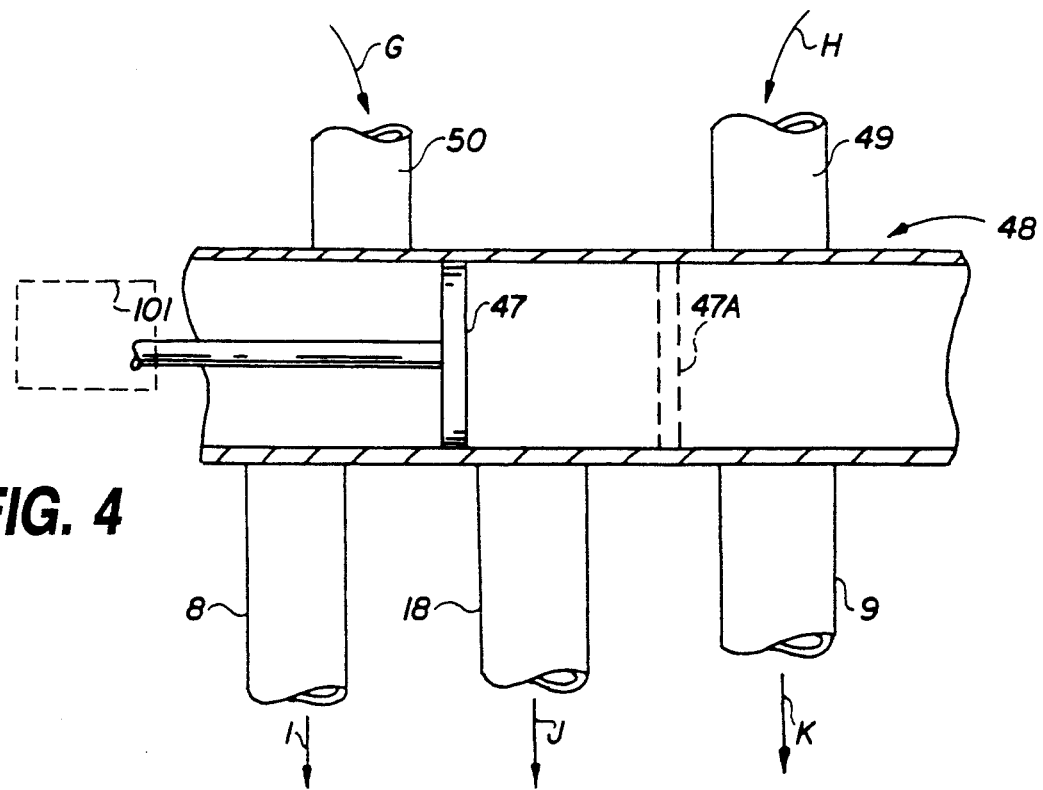
FIG. 4 is an top partial section view illustrating a system for shunting processing fluids in the apparatus of FIGS. 1 and 2; and, FIG. 5 is a perspective view illustrating apparatus for securing together a pair of housings for processing circuit board substrates.

FIG. 4 illustrates a primary fluid input conduit 48 provided with first and second fluid input ports connected to secondary conduits 49 and 50 for inputting fluid into conduit 48 in the directions indicated by arrows G and H. Outlet conduits or spray bars 8, 9, and 18 are each attached to an outlet port formed in conduit 48. Piston 47 sealingly slidably engages the inner cylindrical surface of conduit 48. Means 101 are provided for sliding piston 47 along the inside of conduit 48 in directions parallel to the longitudinal axis or centerline circumscribed by cylindrical conduit 48.

In use of the shunting apparatus of FIG. 4, when piston 47 is in the position shown in FIG. 4, fluid entering conduit 48 from conduit 50 exits through spray bar 8 and fluid entering conduit 48 from conduit 49 exits through spray bars 9 and 18. When piston 47 is slidably displaced along conduit 48 to the position indicated by dashed lines 47A, fluid entering conduit 48 from conduit 50 exits through spray bars 8 and 18 in the directions indicated by arrows I and J, and fluid entering conduit 48 from conduit 49 exits through conduit 9 in the direction of arrow K.

Figure 5:
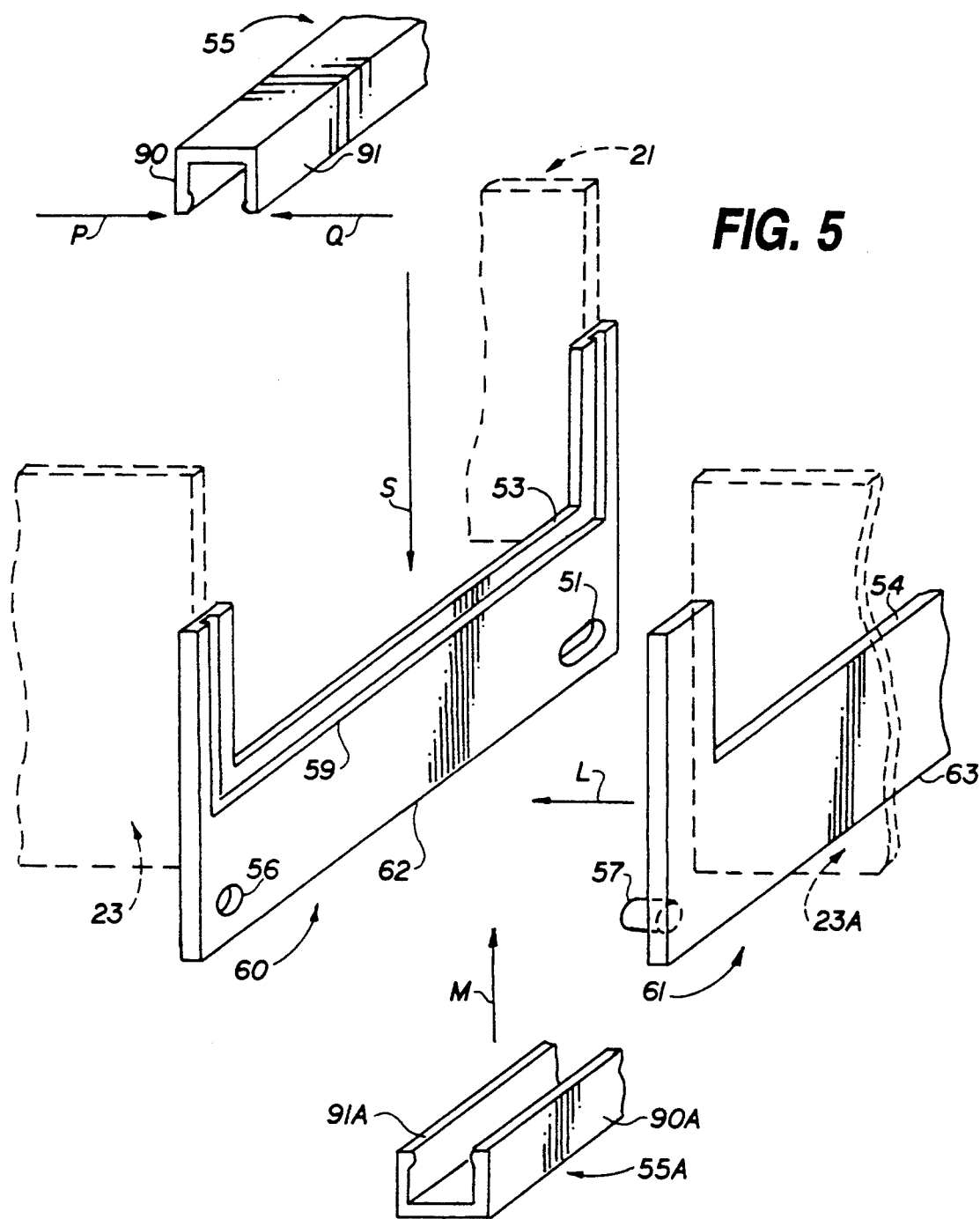

In FIG. 5, U-shaped plate 60 is welded to side walls 21 and 23 or is affixed to walls 21 and 23 with other fastening means. Groove 59 is formed in plate 60. An O-ring (not shown) is seated in and extends outwardly from U-shaped groove 59. U-shaped plate 61 is welded to side walls 21A (not visible) and 23A or is affixed to walls 21A and 23A with other fastening means. Walls 21 and 23 are part of the substrate treatment apparatus illustrated in FIGS. 1 and 2. Walls 21A and 23A are part of a substrate treatment apparatus which also sprays or otherwise processes circuit board substrate apparatus. Plates 60 and 61 are of equal shape and dimension except that plate 60 includes groove 59 while plate 61 has no such groove, plate 60 includes apertures 56 and 51 while plate 61 has no such apertures, plate 61 includes an outwardly projecting cylindrical alignment pin 57 (which fits in aperture 56) and plate 60 has no such pin, and, plate 61 has a second outwardly projecting cylindrical alignment pin (not visible)(which fits in aperture 51) and plate 60 has no such pin. The pair of alignment pins on plate 61 fit into apertures 56 and 51 to align plates 60 and 61 such that comparable portions of the outer edges of each plate are adjacent one another and the plates 60 and 61, when adjacent and contacting, produce a member having a peripheral edge having an outer profile generally equivalent to that of either plate 60 or 61. In use, in order to secure the pair of substrate treatment apparatus in FIG. 1 end-to-end, plate 61 and the processing apparatus to which plate 61 is attached (including sides walls 23A and 21A) is moved in the direction of arrow L such that plate 61 abuts plate 60, plate 61 contacts and compresses the O-ring in groove 59, pin 57 fits in aperture 56, and the other alignment pin (not visible) extending outwardly from plate 61 fits into oval aperture 51. Resilient, elongate U-shaped member 55 is snapped over upper edges 53 and 54 in the direction of arrow S to compress edges 53 and 54 and plates 60 and 61 together. Resilient, elongate U-shaped member 55A is snapped over lower edges 62 and 63 in the direction of arrow M in FIG. 5 to compress edges 62 and 63 together. Resilient legs 90 and 91 of member 55 function to compress edges 53 and 54 against one another in the directions indicated by arrows P and Q. Similarly, the resilient legs 90A and 90B of member 55A function to compress edges 62 and 63 against one another in the directions indicated by arrow P and Q.

Having described my invention in such terms as to enable those skilled in the art to understand and practice it and having identified the presently preferred embodiments and best mode thereof, I claim:

1. Apparatus for contacting with a fluid a substrate traveling through said apparatus, said apparatus including
   (a) a conveyor table for transporting said substrate;
   (b) means for contacting said substrate with a fluid including a shunt system comprising
      (i) a primary fluid input conduit,
      (ii) first and second spaced apart inlet ports formed in said primary conduit,
      (iii) a pair of secondary conduits for inputting fluids into said primary conduit and each connected to a different one of said inlet ports,
      (iv) piston means in said primary conduit to sealingly slidably engage said primary conduit and divide said primary conduit into a pair of discreet fluid chambers such that fluid in one of said discreet chambers is prevented from intermixing with fluid in the other of said discreet chambers
      (v) at least one outlet port formed in said primary conduit generally intermediate said inlet ports,
      (vi) a hollow conduit attached to said outlet port for dispensing fluid onto said substrate,
      (vii) means for moving said piston means from a first operative position intermediate said outlet port and said first inlet port to a second operative position intermediate said outlet port and said second inlet port.

* * * * *